US010672711B2

(12) United States Patent
Zhu et al.

(10) Patent No.: US 10,672,711 B2
(45) Date of Patent: Jun. 2, 2020

(54) WORD LINE CONTACT STRUCTURE FOR THREE-DIMENSIONAL MEMORY DEVICES AND FABRICATION METHODS THEREOF

(71) Applicant: Yangtze Memory Technologies Co., Ltd., Wuhan, Hubei (CN)

(72) Inventors: Jifeng Zhu, Hubei (CN); Zhenyu Lu, Hubei (CN); Jun Chen, Hubei (CN); Si Ping Hu, Hubei (CN); Xiaowang Dai, Hubei (CN); Lan Yao, Hubei (CN); Li Hong Xiao, Hubei (CN); A Man Zheng, Hubei (CN); Kun Bao, Hubei (CN); Haohao Yang, Hubei (CN)

(73) Assignee: Yangtze Memory Technologies Co., Ltd., Wuhan, Hubei (CN)

( * ) Notice: Subject to any disclaimer, the term of this patent is extended or adjusted under 35 U.S.C. 154(b) by 0 days.

(21) Appl. No.: 16/126,947

(22) Filed: Sep. 10, 2018

(65) Prior Publication Data
US 2019/0096810 A1 Mar. 28, 2019

Related U.S. Application Data

(63) Continuation of application No. PCT/CN2018/101308, filed on Aug. 20, 2018.

(30) Foreign Application Priority Data

Aug. 31, 2017 (CN) .......................... 2017 1 0774754

(51) Int. Cl.
*H01L 23/535* (2006.01)
*H01L 27/11551* (2017.01)
(Continued)

(52) U.S. Cl.
CPC ...... *H01L 23/535* (2013.01); *H01L 21/76895* (2013.01); *H01L 27/1157* (2013.01);
(Continued)

(58) Field of Classification Search
CPC ........................................ H01L 27/115–11597
See application file for complete search history.

(56) References Cited

U.S. PATENT DOCUMENTS 7,539,056 B2 * 5/2009 Katsumata ......... G11C 16/0483
365/185.18
8,828,884 B2 9/2014 Lee et al.
(Continued)

FOREIGN PATENT DOCUMENTS

CN 104157654 A 11/2014
CN 104396004 A 3/2015

OTHER PUBLICATIONS

International Search Report and Written Opinion of the International Searching Authority directed to related International Patent Application No. PCT/CN2018/101308, dated Nov. 21, 2018; 6 pages.

*Primary Examiner* — Scott B Geyer
(74) *Attorney, Agent, or Firm* — Sterne, Kessler, Goldstein & Fox P.L.L.C.

(57) ABSTRACT

Embodiments of semiconductor structures including word line contact structures for three-dimensional memory devices and fabrication methods for forming word line contact structures are disclosed. The semiconductor structures include a staircase structure having a plurality of steps, and each step includes a conductive layer disposed over a dielectric layer. The semiconductor structures further include a barrier layer disposed over a portion of the conductive layer of each step. The semiconductor structures also include an etch-stop layer disposed on the barrier layer and an insulating layer disposed on the etch-stop layer. The semiconductor structures also include a plurality of conductive structures formed in the insulating layer and each conductive structure is formed on the conductive layer of each step.

19 Claims, 13 Drawing Sheets

(51) Int. Cl.
*H01L 21/768* (2006.01)
*H01L 27/11529* (2017.01)
*H01L 27/11573* (2017.01)
*H01L 27/11578* (2017.01)
*H01L 27/11582* (2017.01)
*H01L 27/1157* (2017.01)
*H01L 27/11575* (2017.01)

(52) U.S. Cl.
CPC .. *H01L 27/11529* (2013.01); *H01L 27/11551* (2013.01); *H01L 27/11573* (2013.01); *H01L 27/11575* (2013.01); *H01L 27/11578* (2013.01); *H01L 27/11582* (2013.01)

(56) References Cited

U.S. PATENT DOCUMENTS

| | | |
|---|---|---|
| 9,419,013 B1 * | 8/2016 | Lee .................. H01L 27/11582 |
| 9,515,086 B2 | 12/2016 | Yon et al. |
| 2010/0013049 A1 | 1/2010 | Tanaka et al. |
| 2010/0207195 A1 * | 8/2010 | Fukuzumi .......... G11C 16/0483 257/326 |
| 2011/0031546 A1 * | 2/2011 | Uenaka ............. H01L 27/11573 257/316 |
| 2011/0169071 A1 * | 7/2011 | Uenaka ................ H01L 27/105 257/326 |
| 2013/0313627 A1 | 11/2013 | Lee et al. |
| 2013/0337646 A1 | 12/2013 | Cernea et al. |
| 2014/0106569 A1 | 4/2014 | Oh et al. |
| 2014/0284675 A1 | 9/2014 | Watanabe |
| 2016/0020169 A1 * | 1/2016 | Matsuda ............... H01L 23/528 257/758 |
| 2016/0118398 A1 | 4/2016 | Yon et al. |
| 2016/0358855 A1 * | 12/2016 | Oh ...................... H01L 23/5226 |
| 2017/0236836 A1 | 8/2017 | Huo et al. |

\* cited by examiner

WORD LINE CONTACT STRUCTURE FOR THREE-DIMENSIONAL MEMORY DEVICES AND FABRICATION METHODS THEREOF

INCORPORATION BY REFERENCE

This application claims priority to Chinese Patent Application No. 201710774754.6, filed on Aug. 31, 2017 and PCT Patent Application No. PCT/CN2018/101308, filed on Aug. 20, 2018, which are incorporated herein by reference in their entirety.

TECHNICAL FIELD

The present disclosure generally relates to the field of semiconductor technology, and more particularly, to a method for forming a three-dimensional (3D) memory device.

BACKGROUND

Planar memory cells are scaled to smaller sizes by improving process technology, circuit design, programming algorithm, and fabrication process. However, as feature sizes of the memory cells approach a lower limit, planar process and fabrication techniques become challenging and costly. As such, memory density for planar memory cells approaches an upper limit. A three-dimensional (3D) memory architecture can address the density limitation in planar memory cells.

BRIEF SUMMARY

Embodiments of a word line contact structure for three-dimensional (3D) memory array and methods for forming the same are described in the present disclosure.

In some embodiments, a method for forming a 3D memory structure is described. The method includes forming a stack of films on a substrate. The stack of films includes a plurality of alternatingly-arranged oxide and nitride layers. The method also includes etching the stack of films to form a staircase structure. The method further includes forming a second oxide layer on the stack of films. The method includes forming an etch-stop layer on the top surface of the second oxide layer of the staircase structure.

The method further includes disposing a filling material on the etch-stop layer of the staircase structure. The filling material can be a third oxide layer. Using chemical-mechanical-polishing (CMP) processes, for example, the top surface of the third oxide layer over each level of staircase structure is made coplanar with the top surface of the uppermost portion of the etch-stop layer.

The method also includes etching through the stack of films, from the top surface of the uppermost etch-stop layer down to the substrate surface, to form openings that expose the substrate. Through these openings, nitride layers of the staircase structure can be removed and replaced by high-k dielectric materials and metal films.

The method also includes etching the third oxide layer with highly selective etching and exposing the etch-stop layer of each level of the staircase structure for vertical interconnect access (VIA). The method also includes removing exposed etch-stop layer in the openings of contact VIAs by reverse selective etching and further exposing the second oxide layer on each level of the staircase structure. The method includes removing the exposed second oxide layer and high-k dielectric material in the openings of contact VIAs and exposing the metal film of each level of the staircase structure. The method also includes forming metallic connections to the metal film of each level of the staircase structure through subsequent metal filling and polishing.

In some embodiments, the etch-stop layer can include silicon nitride.

In some embodiments, the metal film surrounded by high-k dielectric material can include tungsten.

In some embodiments, the high-k dielectric material can include hafnium oxide, zirconium oxide, aluminum oxide, tantalum oxide, lanthanum oxide films, or a combination thereof.

In some embodiments, the 3D memory structure can be formed with any one of the processes stated above.

In some embodiments, a 3D memory structure includes a substrate and a film stack having a plurality of alternatingly-arranged first oxide and metal films surrounded by high-k dielectric layers. The film stack has a staircase shape and is formed on the surface of the substrate. The 3D memory structure further includes a second oxide layer, also in the shape of staircase, over the film stack of the staircase structure. The 3D memory structure also includes an etch-stop film, in the shape of staircase, over the second oxide layer of the staircase structure. The 3D memory structure further includes a third oxide film formed on the etch-stop layer. A top surface of the third oxide film is formed coplanar with a top surface of the uppermost portion of etch-stop layer over the staircase structure. The 3D memory structure further includes openings for vertical interconnect access (VIA) that extend through the third oxide layer, the etch-stop film, the second oxide layer, and the high-k dielectric layers to expose the metal film. The 3D memory structure further includes contact openings that extend through the staircase structure that expose the substrate to facilitate the formation of contacts.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
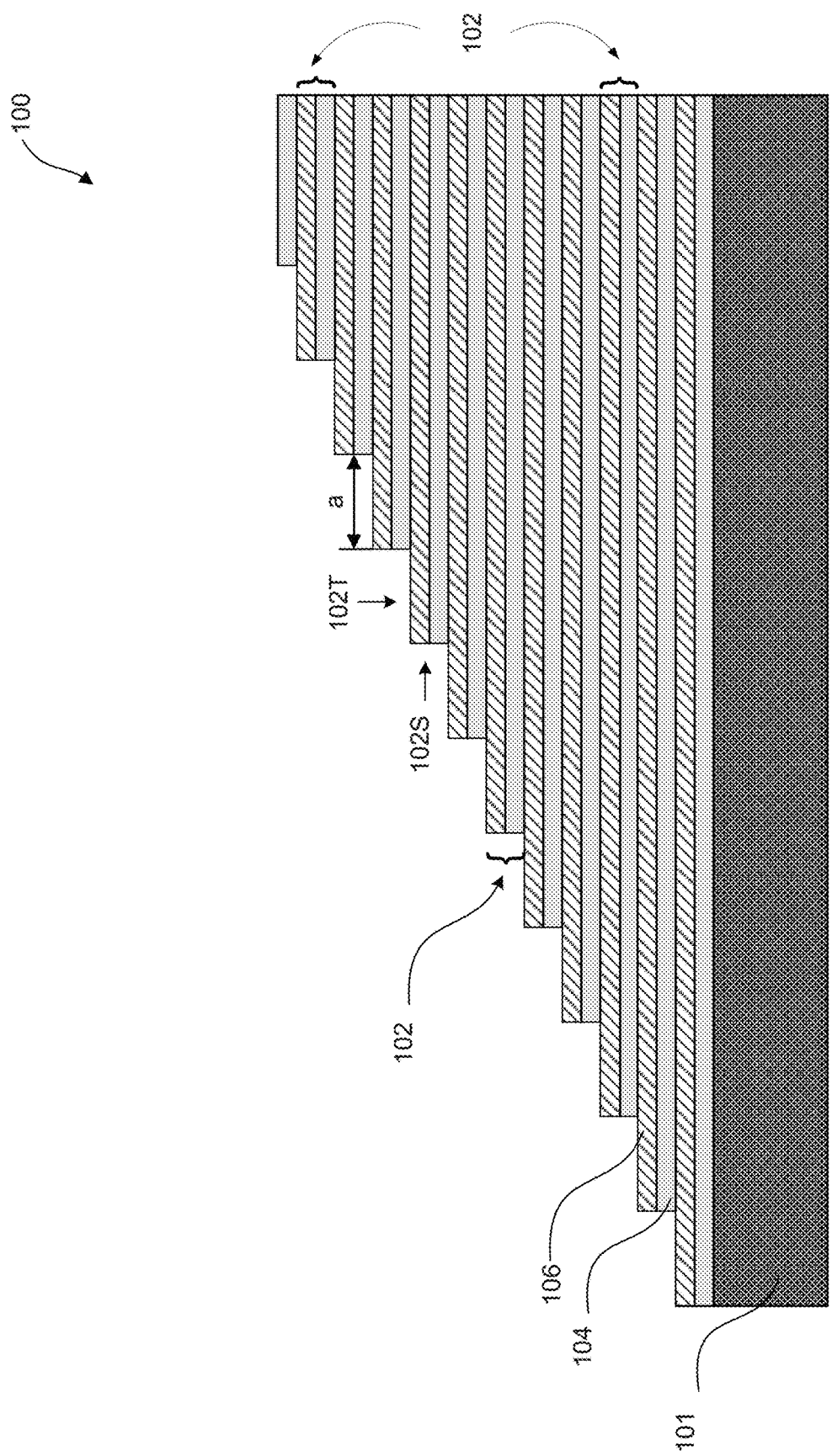
FIG. 1 illustrates a cross-sectional view of a staircase structure with a stack of films including a plurality of alternatingly insulating layers and sacrificial layers, in accordance with some embodiments of the present disclosure.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described can include a particular feature, structure, or characteristic, but every embodiment can not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure or characteristic in connection with other embodiments whether or not explicitly described.

In general, terminology can be understood at least in part from usage in context. For example, the term "one or more" as used herein, depending at least in part upon context, can be used to describe any feature, structure, or characteristic in a singular sense or can be used to describe combinations of features, structures or characteristics in a plural sense. Similarly, terms, such as "a," "an," or "the," again, can be understood to convey a singular usage or to convey a plural usage, depending at least in part upon context. In addition, the term "based on" can be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something, but also includes the meaning of "on" something with an intermediate feature or a layer therebetween. Moreover, "above" or "over" not only means "above" or "over" something, but can also include the meaning it is "above" or "over" something with no intermediate feature or layer therebetween (i.e., directly on something).

Further, spatially relative terms, such as "beneath," "below," "lower," "above," "upper," and the like, can be used herein for ease of description to describe one element or feature's relationship to another element(s) or feature(s) as illustrated in the figures. The spatially relative terms are intended to encompass different orientations of the device in use or process step in addition to the orientation depicted in the figures. The apparatus can be otherwise oriented (rotated 90 degrees or at other orientations) and the spatially relative descriptors used herein can likewise be interpreted accordingly.

As used herein, the term "substrate" refers to a material onto which subsequent material layers are added. The substrate includes a top surface and a bottom surface. The top surface of the substrate is where a semiconductor device is formed, and therefore the semiconductor device is formed at a top side of the substrate. The bottom surface is opposite to the top surface and therefore a bottom side of the substrate is opposite to the top side of the substrate. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer has a top side and a bottom side where the bottom side of the layer is relatively close to the substrate and the top side is relatively away from the substrate. A layer can extend over the entirety of an underlying or overlying structure, or can have an extent less than the extent of an underlying or overlying structure. Further, a layer can be a region of a homogeneous or inhomogeneous continuous structure that has a thickness less than the thickness of the continuous structure. For example, a layer can be located between any set of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or vias are formed) and one or more dielectric layers.

As used herein, the term "nominal/nominally" refers to a desired, or target, value of a characteristic or parameter for a component or a process step, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30%/o of the value (e.g., ±10%, ±20%, or ±30% of the value).

In the present disclosure, the term "horizontal/horizontally/lateral/laterally" means nominally parallel to a lateral surface of a substrate. In the present disclosure, the term "each" may not only necessarily mean "each of all," but can also mean "each of a subset."

As used herein, the term "3D memory device" refers to a semiconductor device with vertically oriented strings of memory cell transistors (referred to herein as "memory strings," such as NAND strings) on a laterally-oriented substrate so that the memory strings extend in the vertical direction with respect to the substrate. As used herein, the term "vertical/vertically" means nominally perpendicular to the lateral surface of a substrate.

In some embodiments, a NAND string or a 3D memory device includes a semiconductor pillar (e.g., silicon pillar) that extends vertically through a plurality conductor/dielectric layer pairs. The plurality of conductor/dielectric layer pairs are also referred to herein as an "alternating conductor/dielectric stack." The conductor layer of the alternating conductor/dielectric stack can be used as a word line (electrically connecting one or more control gates). An intersection of a word line and the semiconductor pillar forms a memory cell. Vertically-oriented memory strings require an electrical connection between the conductors materials (e.g., word line plates or control gates) and access lines (e.g., back end of line interconnection) so that each of the memory cells along the memory strings or in the 3D memory device can be uniquely selected for writing or reading functions. One method of forming electrical connections includes forming a staircase structure on an alternating conductor/dielectric stack.

As the demand for higher storage capacity continues to increase, the number of vertical levels of the memory cells and staircase structures also increases. Accordingly, it is challenging to balance the manufacturing throughput and the process complexity/cost.

Lithography and etching processes can be used to open contact areas for forming electrical connection to the conductive layer on each level of the staircase structure. Due to topology of staircase structures, depth of the contact hole from the top surface to each level of the staircase depends on the location of each level. For example, contact holes for lower levels may be deeper than contact holes for upper levels. Typically, all of the contact holes are formed with a single lithography mask and etching process. Often, before contact holes to the bottom levels are entirely formed, the materials exposed in contact holes at the upper levels are over-etched and lost. To resolve this issue, two or more lithography masks are used to separate etching processes, which adds cost and complexity to the fabrication process.

Various embodiments in the present disclosure provide methods and structures for improving word line contacts for 3D memory devices. In the present disclosure, a single lithography mask can be used to form contact areas for word lines of 3D memory array. By adding an etch-stop film over the staircase structure, openings of the vertical interconnect access (VIA) contacts for each level of the staircase structure can be formed simultaneously. The etch-stop film protects underlying layers during etching processes that form contact VIAs. The etch-stop film is exposed on each level of the staircase structure by a selective etching process, and then removed by reverse selective etching. Accordingly, the disclosed methods and structures can improve fabrication yield and reduce cost. The methods and structures described herein can be used to form semiconductor interconnect structures for inter-connecting components at different layers with an uneven topology.

FIG. 1 illustrates a staircase structure 100 having an alternating layer stack on a top surface of a substrate 101. Each staircase step includes a staircase layer (SC layer) 102, wherein the SC layer 102 includes an exposed top surface 102T and a side surface 102S. Each SC layer 102 includes a first insulating layer 104 and a sacrificial layer 106. The bottommost and the uppermost material of the staircase structure 100 can include the first insulating layer 104.

In some embodiments, the substrate 101 includes any suitable material for supporting the 3D memory structure. For example, the substrate 101 can include silicon, silicon germanium, silicon carbide, silicon on insulator (SOI), germanium on insulator (GOI), glass, gallium nitride, gallium arsenide, any suitable III-V compounds, any other suitable material, and/or combinations thereof.

In some embodiments, the first insulating layer 104 can include any suitable insulating materials, for example, silicon oxide, silicon oxynitride, silicon nitride, TEOS, aluminum oxide, or silicon oxide with F-, C-, N-, and/or H-incorporation.

In some embodiments, the sacrificial layer 106 includes any suitable material that is different from the first insulating layer 104 and can be removed selectively. For example, the sacrificial layer 106 can include silicon oxide, silicon oxynitride, silicon nitride, TEOS, poly-crystalline silicon, poly-crystalline germanium, poly-crystalline germanium-silicon, and/or combinations thereof. In some embodiments, the sacrificial layer 106 also includes amorphous semiconductor materials, such as amorphous silicon or amorphous germanium.

In some embodiments, the first insulating layer 104 can be silicon oxide and the sacrificial layer 106 can be silicon nitride.

In some embodiments, a thickness of the first insulating layer 104 or the sacrificial layer 106 can be between about 10 nm and about 200 nm. In some embodiments, a thickness of the SC layer 102 can be different for each staircase level.

The formation of the first insulating layer 104 and the sacrificial layer 106 can include any suitable deposition methods such as, chemical vapor deposition (CVD), physical vapor deposition (PVD), plasma-enhanced CVD (PECVD), low pressure chemical vapor deposition (LPCVD), sputtering, metal-organic chemical vapor deposition (MOCVD), atomic layer deposition (ALD), any other suitable deposition method, and/or combinations thereof. In some embodiments, poly-crystalline semiconductor material can be deposited in an amorphous state and converted to poly-crystalline through subsequent thermal treatments.

The plural steps of the staircase structure 100 is formed by applying a repetitive etch-trim process on the disposed film stacks using a mask stack (not shown). In some embodiments, the mask stack can include a photoresist or carbon-based polymer material. In some embodiments, the mask stack is removed after forming the staircase structure 100.

The etch-trim process includes an etching process and a trimming process. During the etching process, the portion of SC layer 102 with exposed top surface 102T are removed. The etch depth is a thickness of the SC layer 102. The etching process for the first insulating layer 104 can have a high selectivity over the sacrificial layer 106, and/or vice versa. Accordingly, an underlying SC layer 102 can function as an etch-stop layer. As a result, one staircase step is formed during each etch-trim cycle.

In some embodiments, the SC layer 102 can be etched using an anisotropic etching such as a reactive ion etch (RIE) or other dry etch processes. In some embodiments, the etchant can include fluorine based gases such as, for example, carbon-fluorine ($CF_4$) based gases, hexafluoroethane ($C_2F_6$) based gases, and/or any other suitable gases. In some embodiments, the SC layer 102 can be removed by wet chemistry, such as hydrofluoric acid or a mixture of hydrofluoric acid and ethylene glycol. In some embodiments, a timed etching approach can be used. The methods and etchants to remove a single layer stack should not be limited by the embodiments of the present disclosure.

The trimming process includes applying a suitable etching process (e.g., an isotropic dry etch or a wet etch) on the mask stack such that the mask stack can be pulled back laterally. The lateral pull-back dimension determines the lateral dimension "a" of each step of the staircase structure 100, as illustrated in FIG. 1. After mask stack trimming, one portion of the topmost SC layer 102 is exposed and the other portion of the topmost SC layer 102 remains covered by the mask stack. The next cycle of etch-trim process resumes with the etching process.

In some embodiments, the mask stack trimming process can include dry etching, such as RIE using $O_2$, Ar, $N_2$, etc.

In some embodiments, the topmost SC layer 102 can be covered by the first insulating layer 104. A process step of removing the first insulating layer 104 can be added to the etching process of each etch-trim cycle to form the staircase structure 100.

Figure 2:
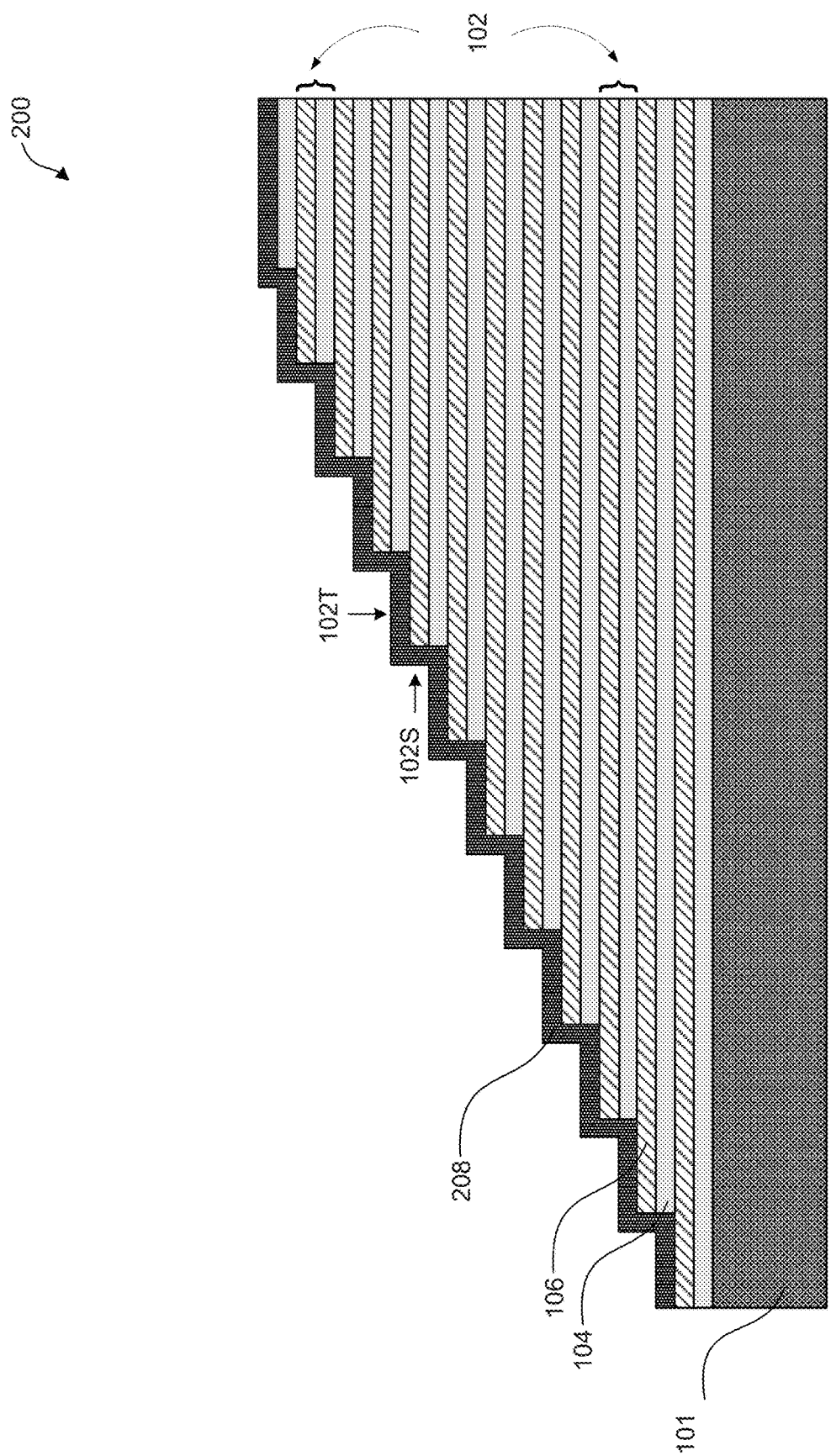
FIG. 2 illustrates a cross-sectional view of a staircase structure and an insulating layer formed on the staircase structure, in accordance with some embodiments of the present disclosure.

Referring to FIG. 2, a staircase structure 200 is formed by disposing a second insulating layer 208 on the staircase structure 100. The second insulating layer 208 covers the staircase structure 100, including a top surface 102T and a side surface 102S of each SC layer 102 (shown in FIG. 1). In some embodiments, the second insulating layer 208 can be an optional barrier layer. For example, the second insulating layer 208 can be used as a barrier layer for protecting the underlying structure during subsequent etching processes. In some embodiments, thicknesses of the second insulating layer 208 can be about the same on a side surface 102S and a top surface 102T. In some embodiments, thickness of the second insulating layer 208 on the side surface 102S can be thicker or thinner than that on the top surface 102T. In some embodiments, a thickness of the second insulating layer 208 can be in a range between 1 nm to 200 nm (e.g., 1 nm, 2 nm, 3 nm, 4 nm, 5 nm, 6 nm, 7 nm, 8 nm, 9 nm, 10 nm, 20 nm, 40 nm, 50 nm, 60 nm, 80 nm, 90 nm, 100 nm, 140 nm, 160 nm, 170 nm, 200 nm, any range bounded by the lower end by any of these values, or in any range defined by any two of these values). In some embodiments, the second insulating layer 208 can be made of similar material as the first insulating layer 104. In some embodiments, the second insulating layer 208 can be formed using similar techniques as the processes used to form the first insulating layer 104.

Figure 3:
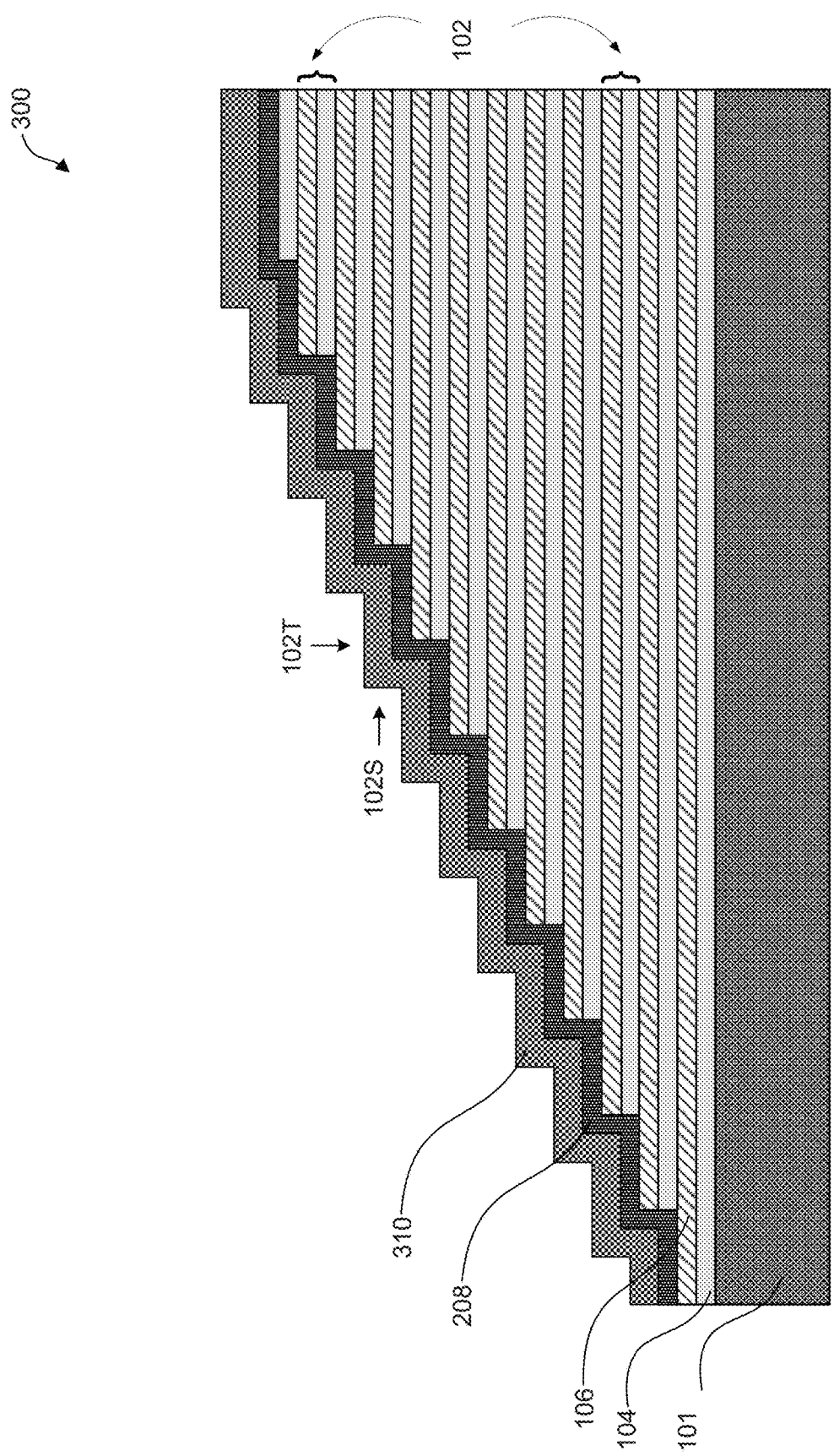
FIG. 3 illustrates a cross-sectional view of a staircase structure and an etch-stop layer formed on the staircase structure, in accordance with some embodiments of the present disclosure.

Referring to FIG. 3, a staircase structure 300 is formed by disposing an etch-stop layer 310 on the staircase structure 200. A thickness of the etch-stop layer 310 can be in a range between 10 nm to 1000 nm (e.g., 10 nm, 20 nm, 30 nm, 40 nm, 50 nm, 60 nm, 70 nm, 80 nm, 90 nm, 100 nm, 200 nm, 300 nm, 400 nm, 500 nm, 600 nm, 700 nm, 800 nm, 900 nm, 1000 nm, any range bounded by the lower end by any of these values, or in any range defined by any two of these values). The etch-stop layer 310 can be made of any suitable insulating material that is different from the second insulating layer 208. In some embodiments, the etch-stop layer 310 can be disposed on the second insulating layer 208. In some embodiments, the second insulating layer 208 is optional and the etch-stop layer 310 can be directly disposed on the staircase structure 100. In some embodiments, the etch-stop layer 310 can cover the staircase structure 200, including the top surface 102T and the side surface 102S of each SC layer 102. In some embodiments, the thickness of the etch-stop layer 310 on a side surface 102S can be the same as that on a top surface 102T. In some embodiments, the thickness of the etch-stop layer 310 on the side surface 102S can be thicker or thinner than that on the top surface 102T. In some embodiments, etch-stop layer 310 can be made of silicon nitride, silicon oxynitride, spin-on-dielectric, and/or high-k dielectric films such as hafnium oxide, zirconium oxide, aluminum oxide, tantalum oxide, or lanthanum oxide films. In some embodiments, etch-stop layer 310 can be disposed by any suitable methods such as CVD, PVD, PECVD, LPCVD, sputtering, MOCVD, ALD, spin-coating, or any other suitable deposition method, and/or combinations thereof.

Figure 4:
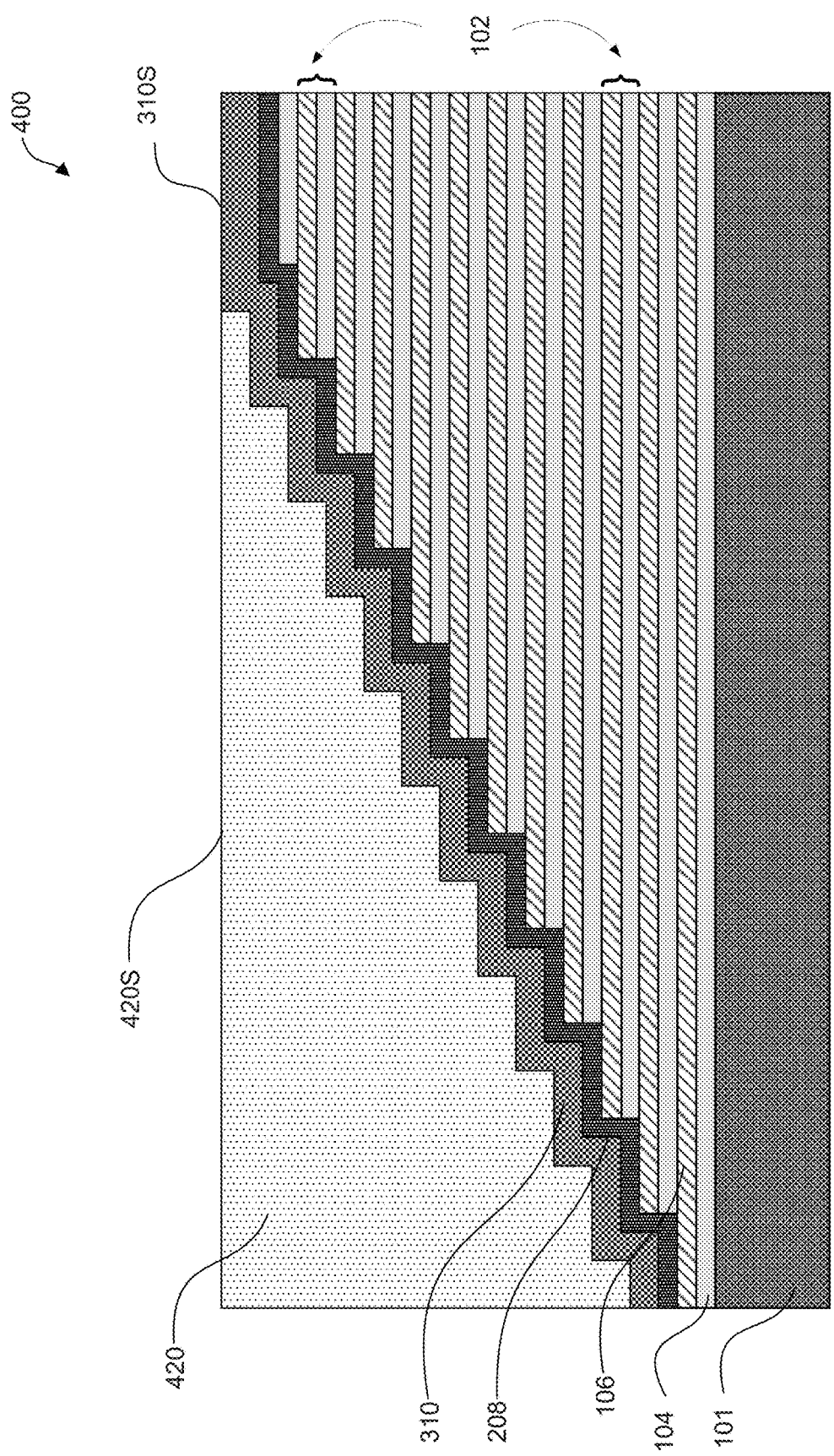
FIG. 4 illustrates a cross-sectional view of a staircase structure filled with an insulating material, in accordance with some embodiments of the present disclosure.

Referring to FIG. 4, a staircase structure 400 is formed by disposing a third insulating layer 420 over the staircase structure 300, with a top surface 420S being coplanar with the top surface 310S of the uppermost portion of the etch-stop layer 310. The third insulating layer 420 can be made of any a suitable insulator that is different from the etch-stop layer 310. In some embodiments, the third insulating layer 420 is made of a similar material as the first insulating layer 104. In some embodiments, the forming of the third insulating layer 420 can use similar techniques as forming the first insulating layer 104. In some embodiments, the forming of the third insulating layer 420 can use any suitable processes such as, for example, a spin-coating process, CVD or high density plasma (HDP) deposition. In some embodiments, the forming of the third insulating layer 420 further includes a planarization process such as chemical-mechanical planarization (CMP). In some embodiments, the third insulating layer 420 can cover each step of the staircase structure 300.

Figure 5A:
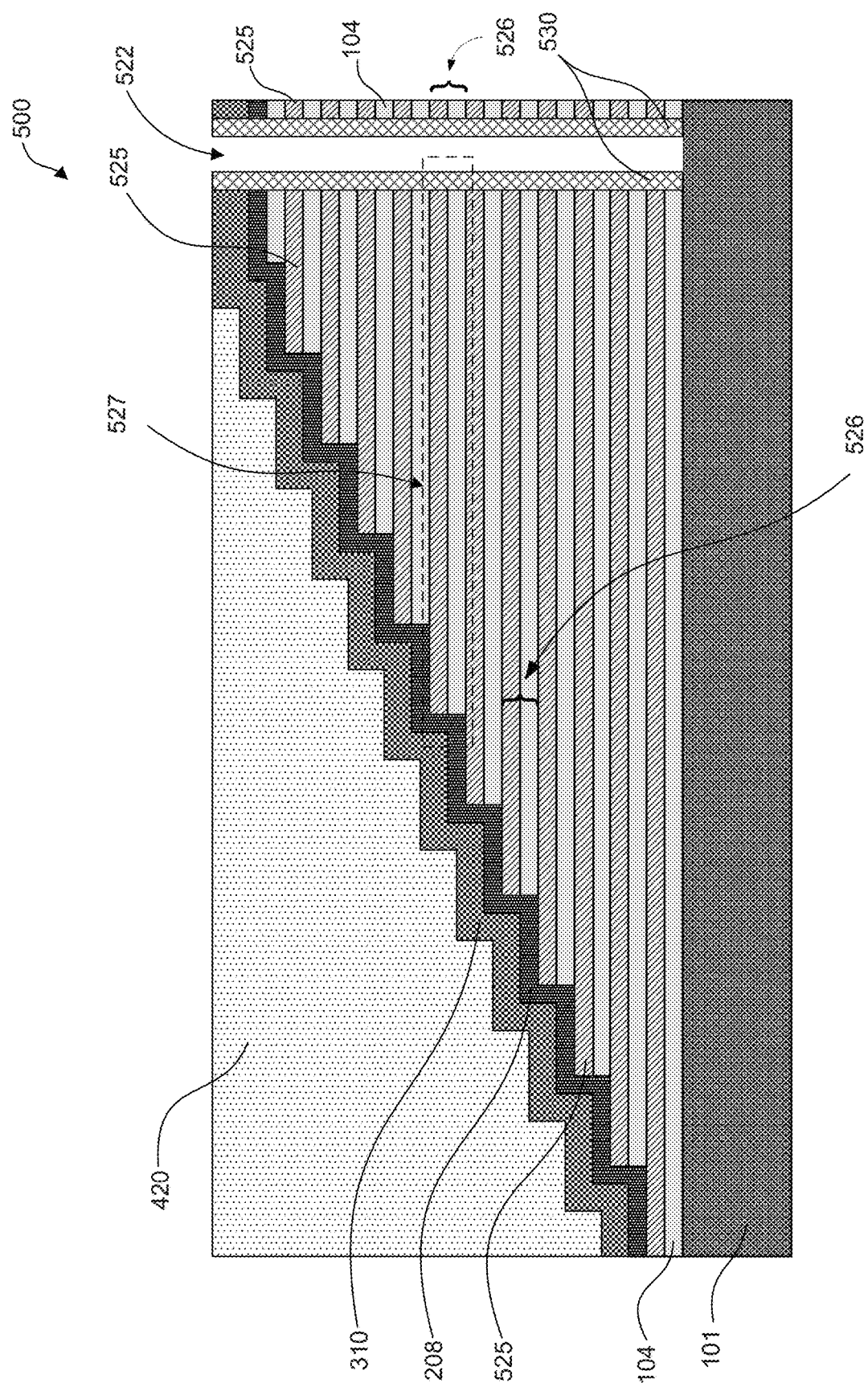
FIGS. 5A and 5B illustrate cross-sectional views of a staircase structure having alternatingly-arranged insulating and gate materials, in accordance with some embodiments of the present disclosure.

Referring to FIG. 5A, a substrate opening 522 is formed in a staircase structure 500 by etching through the entire film stack of the staircase structure 400, exposing the surface of the substrate 101. (Although FIGS. 5A and 5B illustrate one substrate opening 522, it is noted that, the location, shape, total number, and arrangement of the substrate opening 522, relative to the staircase structure 400, is only used for illustration purpose in the present disclosure, which does not limit the scope of the present disclosure.)

In some embodiments, through the substrate opening 522, the sacrificial layer 106 of each SC layer 102 in the staircase structure 400 is removed and replaced by a gate stack 525. The staircase structure 500 includes a plurality of replacement SC layers 526, wherein the replacement SC layer 526 includes the first insulating layer 104 and the gate stack 525. The first insulating layer 104 and the gate stack 525 are alternatingly arranged in the staircase structure 500.

In some embodiments, removing the sacrificial layer 106 includes wet etching or isotropic dry etching that is selective to the first insulating layer 104. For example, the etching rate of the first insulating layer 104 is slower than the etching rate of the sacrificial layer 106. In some embodiments, removing the sacrificial layer 106 is also selective to the second insulating layer 208. In some embodiments, the second insulating layer 208 is optional, and removing the sacrificial layer 106 is selective to the etch-stop layer 310.

Figure 5B:
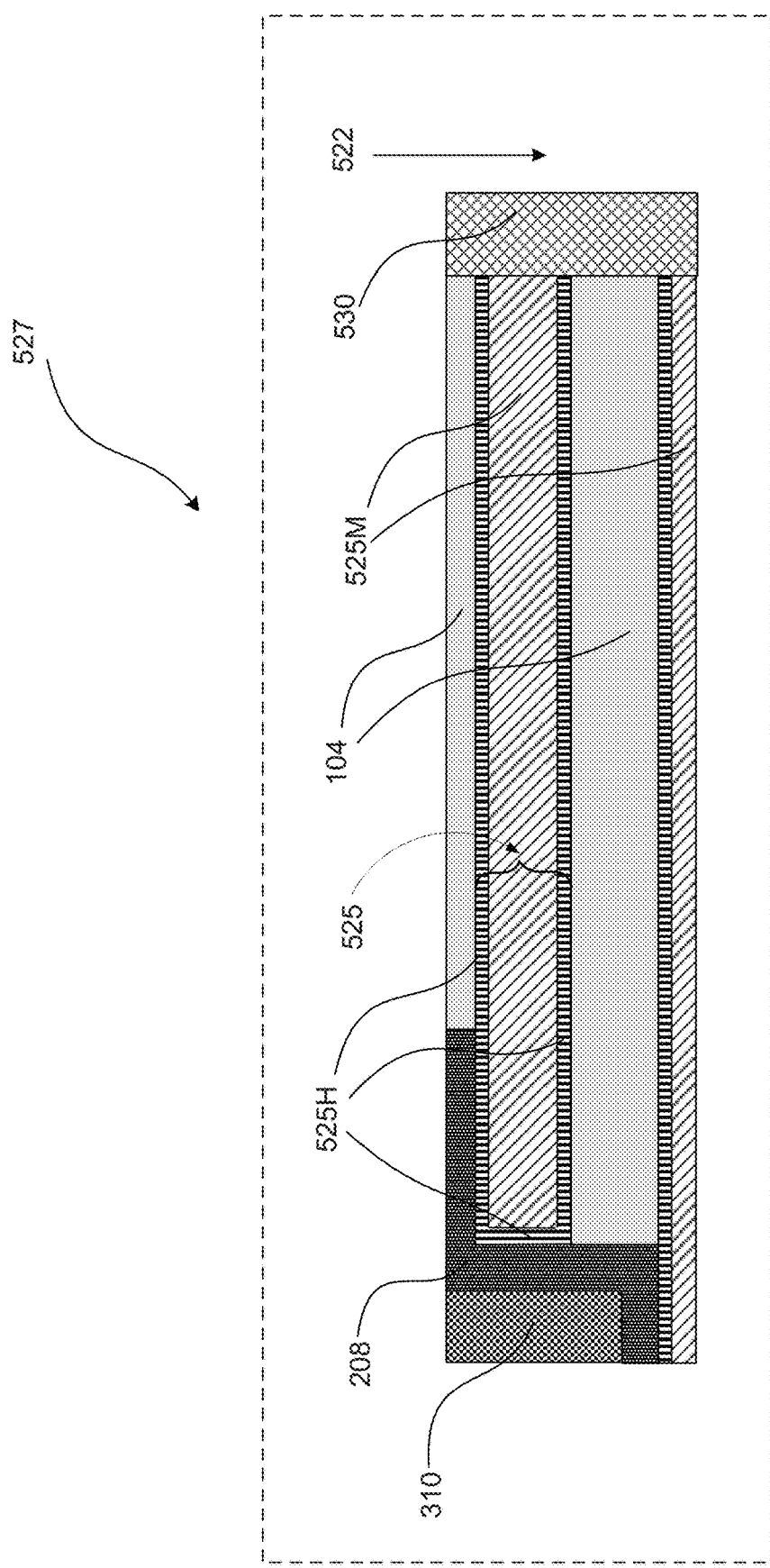

FIG. 5B illustrates the details of a region 527 in FIG. 5A, in accordance with some embodiments of the present disclosure. The gate stack 525 can include a high-k dielectric layer 525H and a gate conductive layer 525M. The gate conductive layer 525M is surrounded by the high-k dielectric layer 525H, with one side next to the substrate opening 522.

In some embodiments, the high-k dielectric layer 525H can include hafnium oxide, zirconium oxide, aluminum oxide, tantalum oxide, or lanthanum oxide films, and/or any combination thereof. The high-k dielectric layer 525H can be disposed by any suitable methods such as CVD, PVD, PECVD, LPCVD, MOCVD, ALD, and/or combinations thereof.

In some embodiments, the gate conductive layer 525M can be made from a metal, such as tungsten, cobalt, nickel, copper, or aluminum, and/or combinations thereof. The metal can be formed by any suitable deposition methods, for example, sputtering, thermal evaporation, e-beam evaporation, ALD, PVD, and/or combinations thereof.

In some embodiments, the gate conductive layer 525M can also be poly-crystalline semiconductors, such as poly-crystalline silicon, poly-crystalline germanium, poly-crystalline germanium-silicon and any other suitable material, and/or combinations thereof. In some embodiments, the poly-crystalline material can be incorporated with any suitable types of dopant, such as boron, phosphorous, or arsenic, and in the form of elements or a compound. In some embodiments, the gate conductive layer 525M can also be amorphous semiconductors.

In some embodiments, the gate conductive layer 525M can be made from a metal silicide, including $WSi_x$, $CoSi_x$, $NiSi_x$, or $AlSi_x$, etc. The forming of the metal silicide material can include forming a metal layer and a poly-crystalline semiconductor using similar techniques described above. The forming of metal silicide can further include applying a thermal annealing process on the deposited metal layer and the poly-crystalline semiconductor layer, followed by removal of unreacted metal.

In some embodiments, the gate stack 525 includes an interface material between the high-k dielectric layer 525H and the gate conductive layer 525M. The interface material can include silicon oxide or silicon oxynitride, etc.

The portion of the gate conductive layer 525M located on the sidewalls of the substrate opening 522 (not illustrated in FIG. 5A or 5B for simplicity), can be removed and replaced by a fifth insulating layer 530. Removal of sidewall portions of gate conductive layer 525M can be achieved by wet-etching or dry-etching. In some embodiments, the fifth insulating layer 530 can be made of the same material as the first insulating layer 104 or the etch-stop layer 310, and formed by similar techniques. In some embodiments, a portion of the fifth insulating layer 530 can be removed from the top surface of substrate 101 and the substrate surface can be exposed for electrical contacts in the subsequent processes. Removing the fifth insulating layer 530 from the substrate surface can be achieved by, for example, anisotropic dry-etching.

Figure 6:
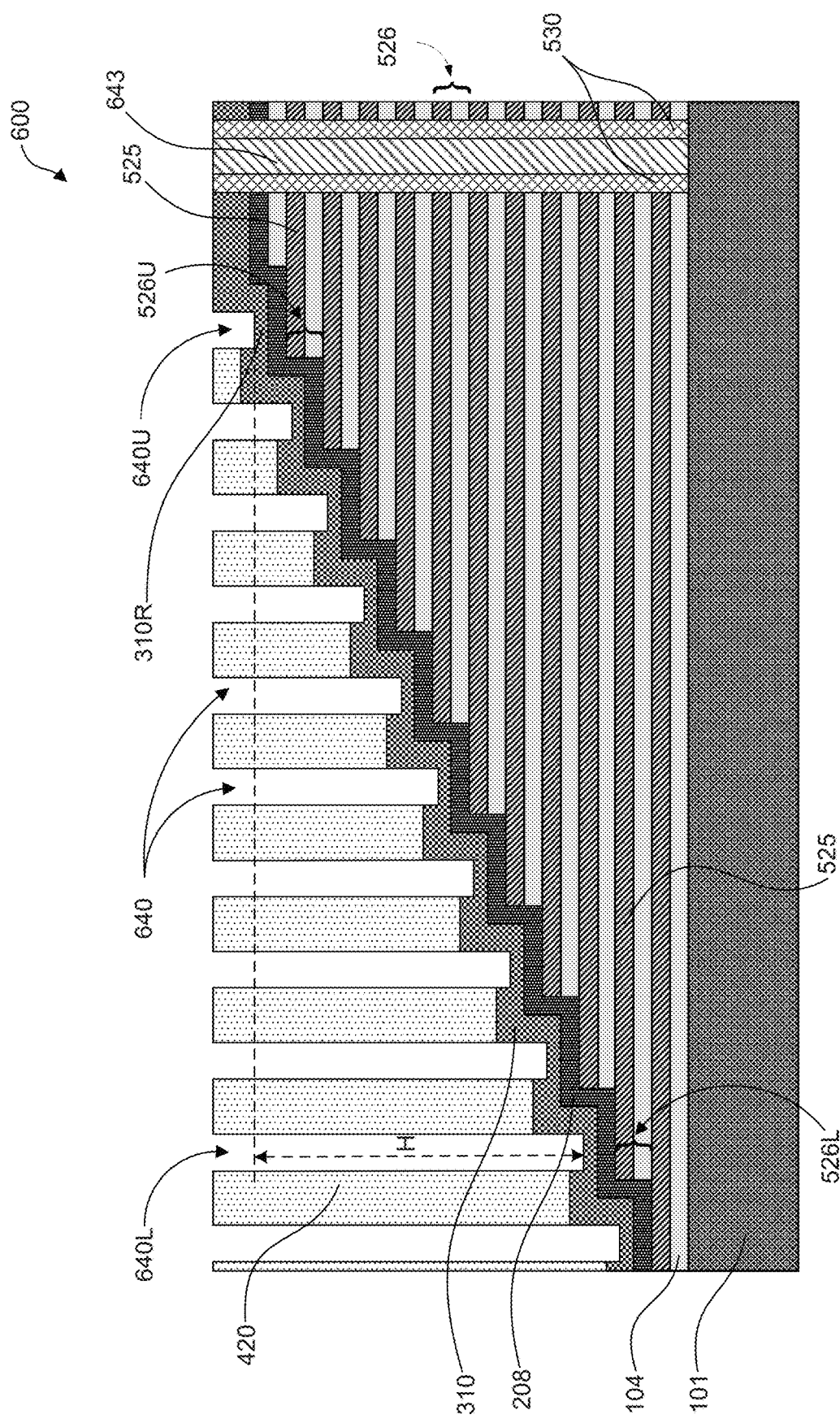
FIG. 6 illustrates a cross-sectional view of a staircase structure after the etching of the insulating films, in accordance with some embodiments of the present disclosure.

Referring now to FIG. 6, a staircase structure 600 includes vertical interconnect access (VIA) openings 640 for each replacement SC layer 526. In some embodiments, photoresist or polymer material can be used as a mask layer (not shown in the figure). A selective etching process can be used such that the etching rate of the third insulating layer 420 is higher than the etching rate of the etch-stop layer 310. During the one or more etching processes that form the VIA openings 640, the etch-stop layer 310 protects the underlying structure until all the VIA openings 640 are formed throughout the staircase structure 600. For example, a VIA opening 640L for a lower replacement SC layer 526L requires longer etch time than a VIA opening 640U for an upper replacement SC layer 526U. An additional thickness H of the third insulating layer 420 needs to be removed. The etch-stop layer 310 can protect underlying materials of the replacement SC layers 526 on upper levels, before the VIA openings 640 are formed for the replacement SC layers 526 on lower levels. For example, during the removal process of the extra thickness H of third insulating layer 420, the etch-stop layer 310 on top of the upper replacement SC layer 526U is not etched through, with a remaining etch stop layer 310R. The remaining etch-stop layer 310R provides protection for the replacement SC layers 526U, where the VIA openings 640U are already formed. The staircase structure 600 is formed after the portion of the third insulating layer 420 inside all the VIA openings 640 are removed for each replacement SC layer 526. The VIA openings 640 extend through the third insulating layer 420 and expose the underlying etch-stop layer 310. In some embodiments, the etch-stop layer 310 can be partially etched in some VIA openings 640, as shown in FIG. 6. In some embodiments, the thickness of the etch-stop layer 310 remains substantially the same during the one or more etching processes that form the VIA openings 640, because etch-stop layer 310 can be inert to the etchant used in the etching processes. In some embodiments, the selective etching includes anisotropic dry etching using chemical etchant such as, for example, $CF_4$, $CHF_3$, $C_2F_6$, or $C_3F_6$, and/or other suitable etchants.

In some embodiments, prior to forming VIA openings 640, a second conductive material can be disposed inside the substrate opening 522 of the staircase structure 500 (see FIG. 5) to form a substrate conductive structure 643 (see FIG. 6). Accordingly, an electrical connection is provided to the substrate 101 from the surface of the staircase structure 600. In some embodiments, the substrate conductive structure 643 can be formed with any suitable conductive material that can be the same as or can be different from the gate conductive layer 525M, and can be disposed using similar techniques. Additional planarization process can be included to form a top surface coplanar with the top surface of the third insulating layer 420.

Figure 7:
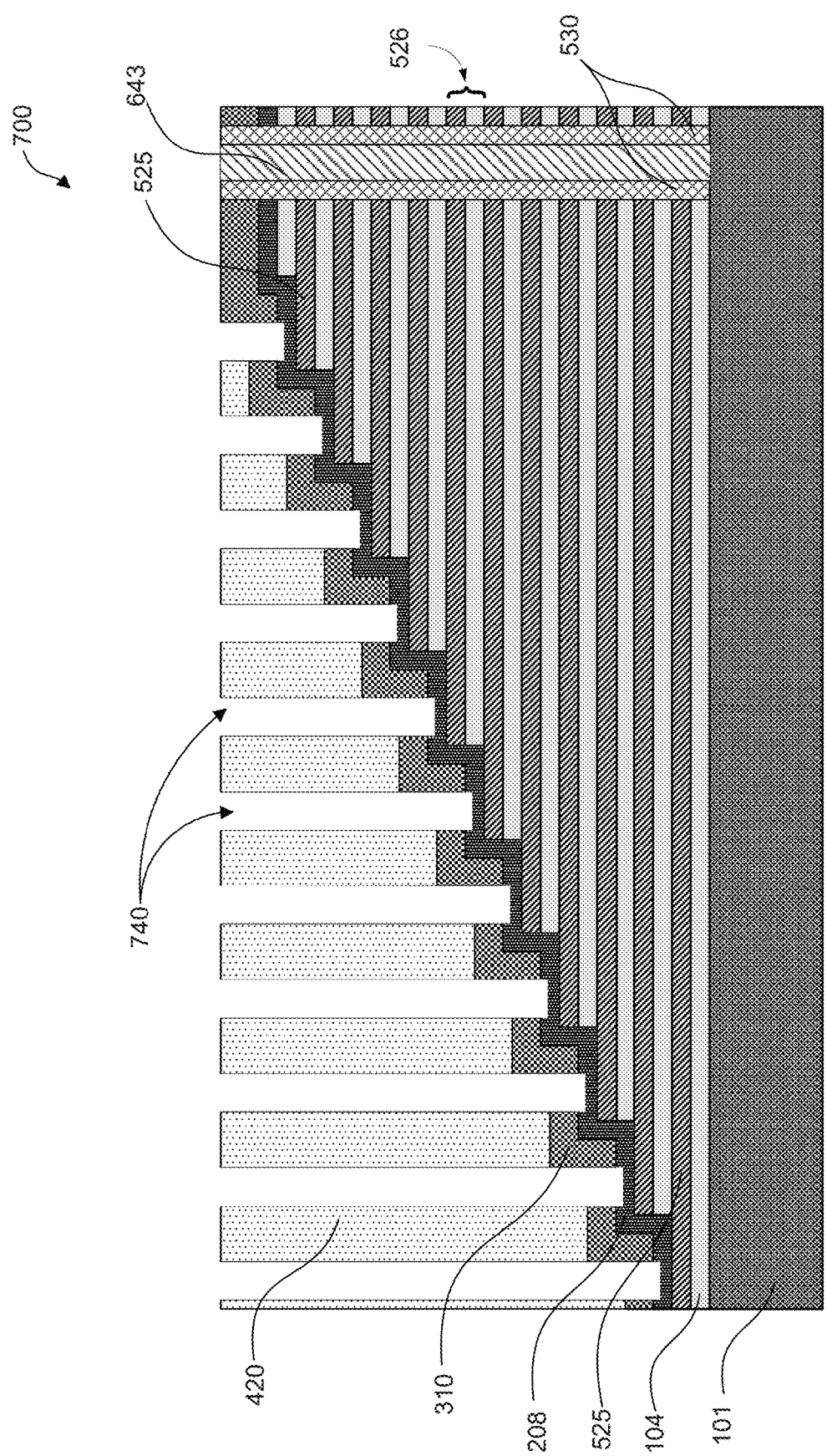
FIG. 7 illustrates a cross-sectional view of a staircase structure after the etching of an etch-stop layer and exposing of an insulating layer, in accordance with some embodiments of the present disclosure.

Referring to FIG. 7, portions of the etch-stop layer 310 inside VIA openings 740 are removed by reverse selective etching. During reverse selective etching, the etch-stop layer 310 can be etched faster than the second insulating layer 208. In some embodiments, the reverse selective etching process includes anisotropic or isotropic dry etching using chemistry, for example, $O_2$, $N_2$, $CF_4$, $NF_3$, $Cl_2$, HBr, $BCl_3$, and/or combinations thereof. In some embodiments, the reverse selective etching process includes wet chemical etching, for example, phosphorus acid. A staircase structure 700 is formed after the portion of etch-stop layer 310 inside the VIA openings 740 is removed for each replacement SC layer 526.

Figure 8A:
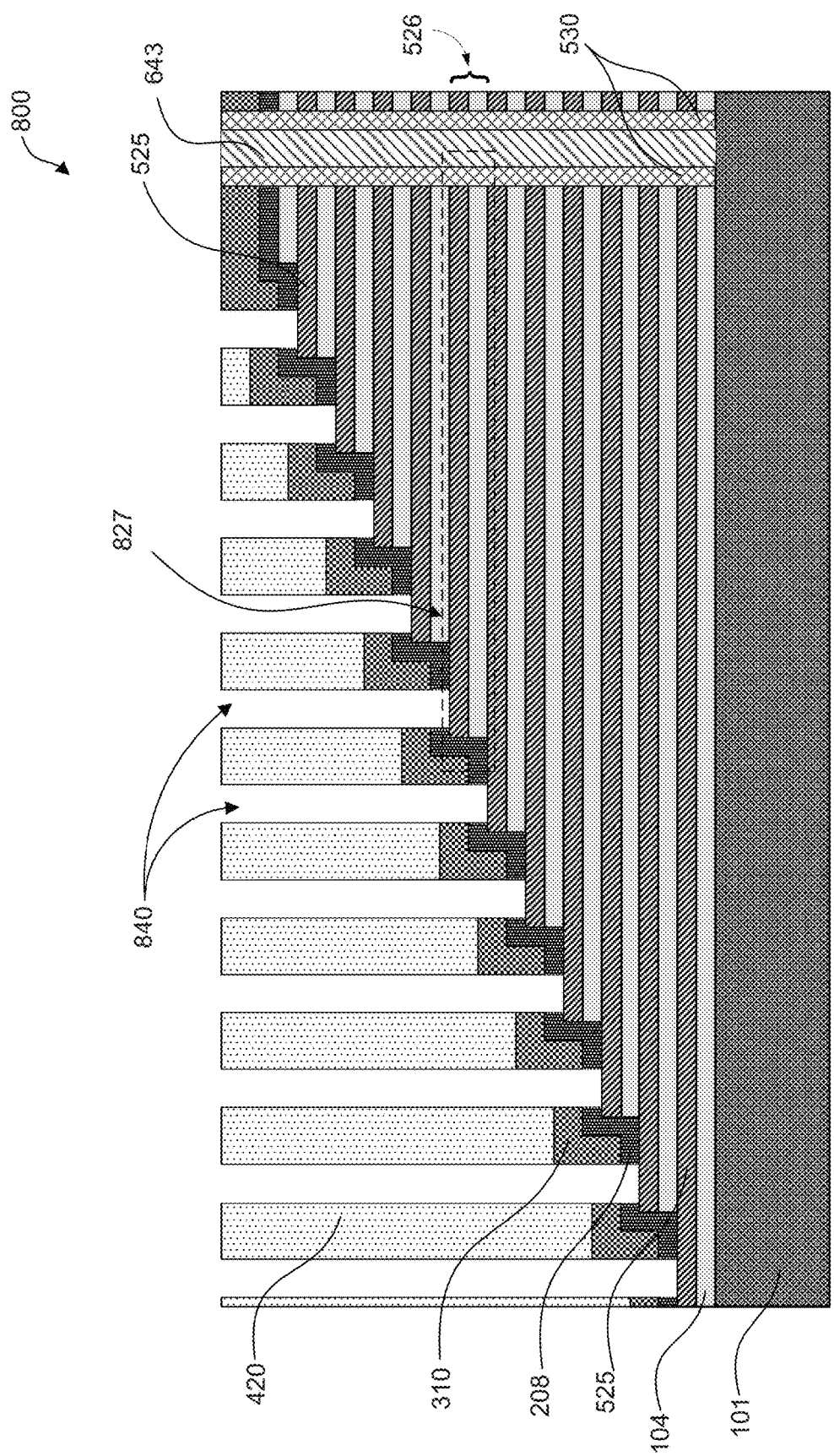
FIGS. 8A and 8B illustrate cross-sectional views of a staircase structure after the etching of an insulating layer and a high-k dielectric layer, in accordance with some embodiments of the present disclosure.
Figure 8B:
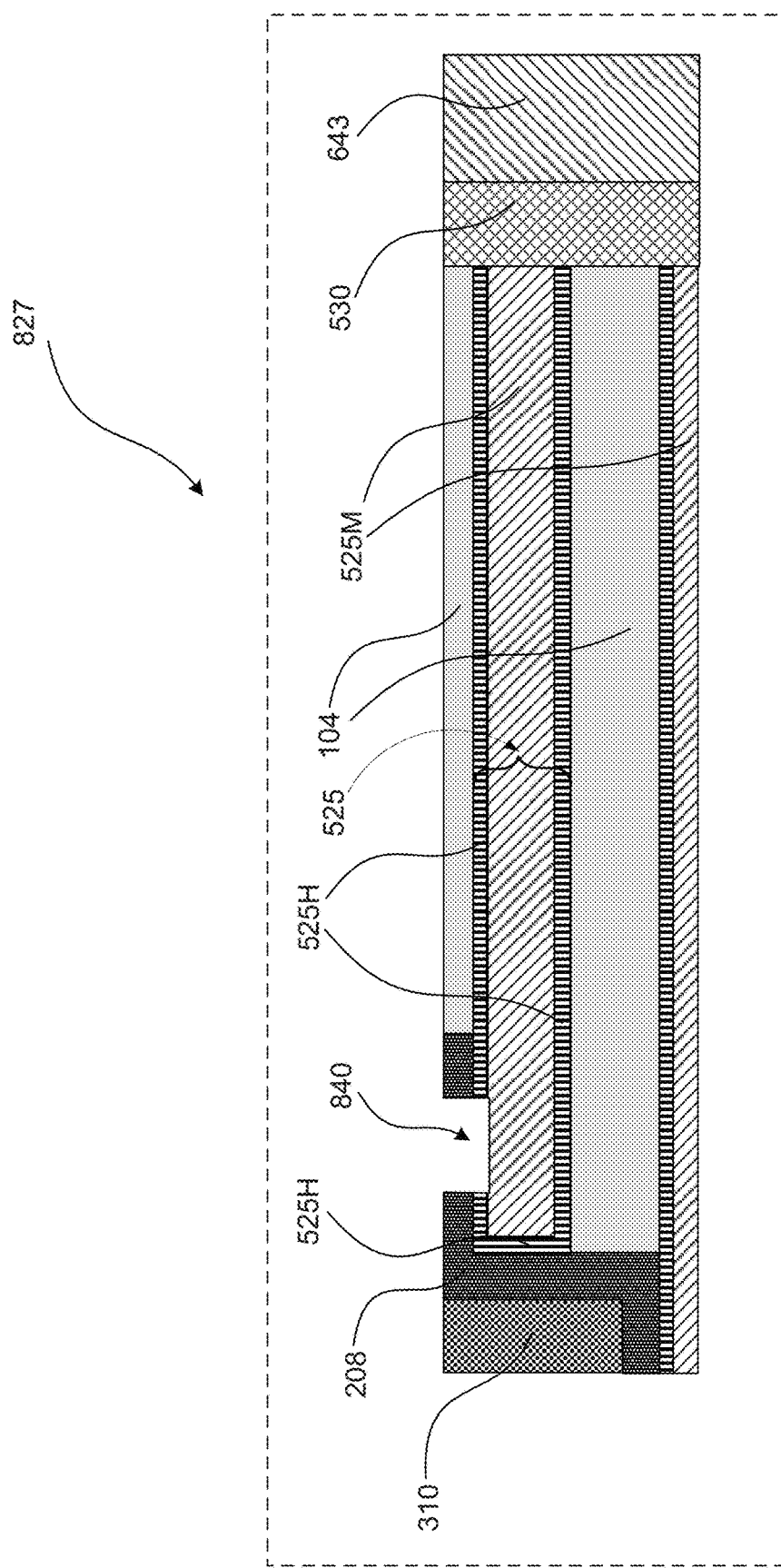

Referring to FIGS. 8A and 8B, a portion of the second insulating layer 208 and a portion of the high-k dielectric layer 525H in gate stack 525 are removed inside the VIA openings 840, forming VIA openings 840 that extend through the third insulating layer 420, the etch-stop layer 310, the second insulating layer 208, and the high-k dielectric layer 525H and exposing the gate conductive layer 525M. In some embodiments, the etching process for etching the second insulating layer 208 and the high-k dielectric layer 525H can be similar to that used for etching the third insulating layer 420 or the etch-stop layer 310. A staircase structure 800 includes a portion of gate conductive layer 525M, which is exposed inside the VIA openings 840 for each replacement SC layer 526, enabling gate contacts for every 3D memory cell.

In some embodiments, the second insulating layer 208 is optional and the etching of the etch stop layer 310 exposes the high-k dielectric layer 525H inside the VIA openings 740/840. The high-k dielectric layer 525H can be removed in the subsequent etching process to further expose the gate conductive layer 525M inside the VIA openings 740/840. The VIA openings 840 extend through the third insulating layer 420, etch-stop layer 310 and the high-k dielectric layer 525H, exposing the gate conductive layer 525M.

Figure 9A:
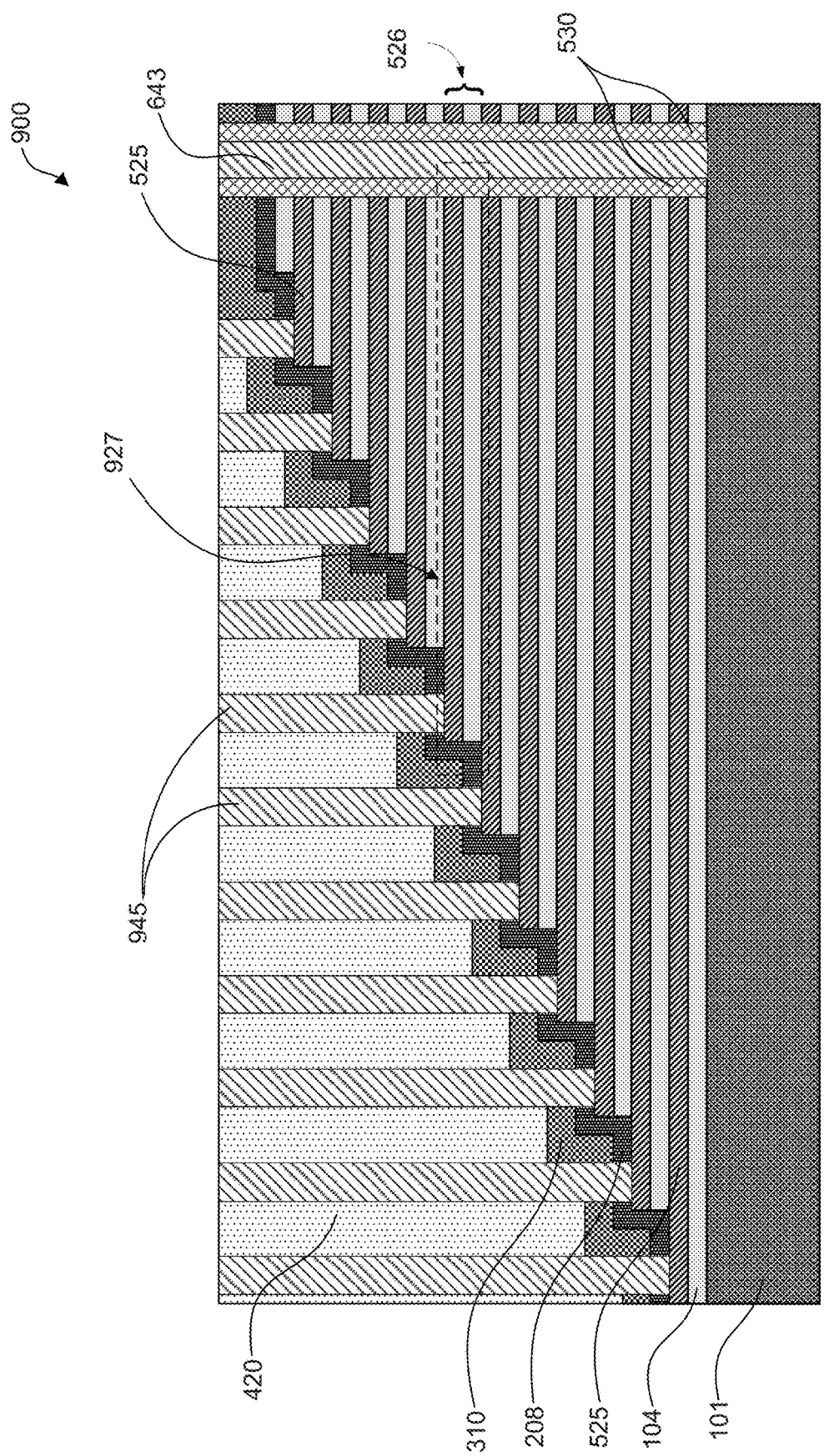
FIGS. 9A and 9B illustrate cross-sectional views of a staircase structure after the filling of openings with a conductive film, in accordance with some embodiments of the present disclosure.
Figure 9B:
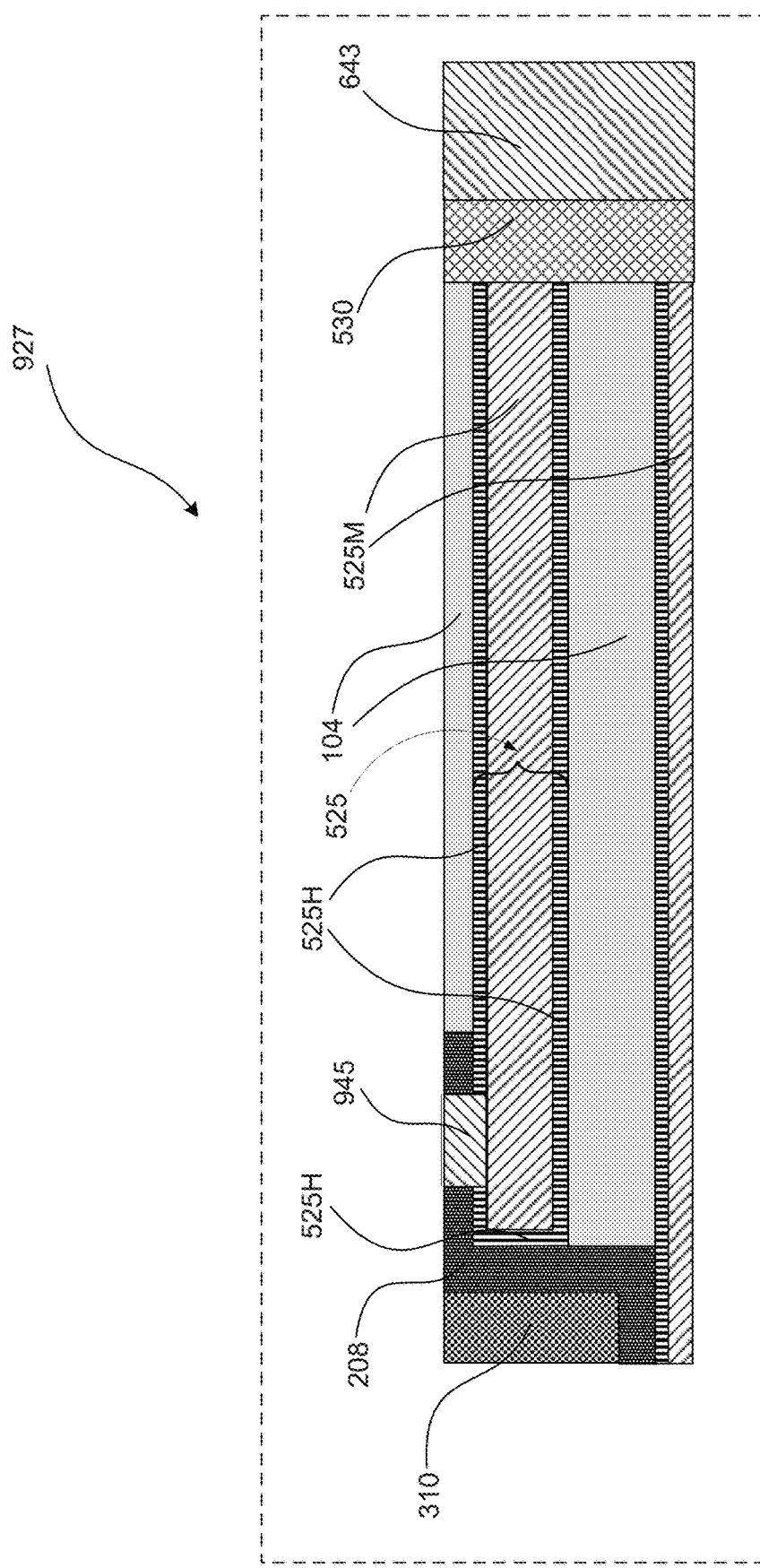

Referring to FIGS. 9A and 9B, a staircase structure 900 includes disposing a third conductive material to form VIA conductive structures 945 in the VIA openings 840. The VIA conductive structures 945 can be formed by disposing a third conductive material in the formed openings 840 and directly on the exposed portions of gate conductive layer 525M. In some embodiments, the VIA conductive structures 945 are directly disposed on the exposed gate conductive layer 525M. In some embodiments, the VIA conductive structures 945 can be made from a similar material as the gate conductive layer 525M. In some embodiments, the VIA conductive structures 945 can be disposed using a similar technique as the gate conductive layer 525M. In some embodiments, the VIA conductive structures 945 can be coplanar with the third insulating layer 420 using a planarization process such as, for example, a CMP process. In the staircase structure 900, the VIA conductive structures 945 can extend through the third insulating layer 420, the etch-stop layer 310, the second insulating layer 208 and the gate dielectric layer 525H, directly contacting and electrically connecting to the gate conductive layer 525M for each corresponding replacement SC layer 526. As discussed above, the second insulating layer 208 can be optional and in such scenarios the VIA conductive structures 945 can extend through the third insulating layer 420, the etch-stop layer 310 and the gate dielectric layer 525H, directly contacting and connected to the gate conductive layer 525M for each corresponding replacement SC layer 526. Therefore, the electrical conductive path for gate stack 525 of each memory cell can be wired up to the surface of the wafer, enabling various configurations of word lines for the 3D memory in the back-of-line process.

Figure 10:
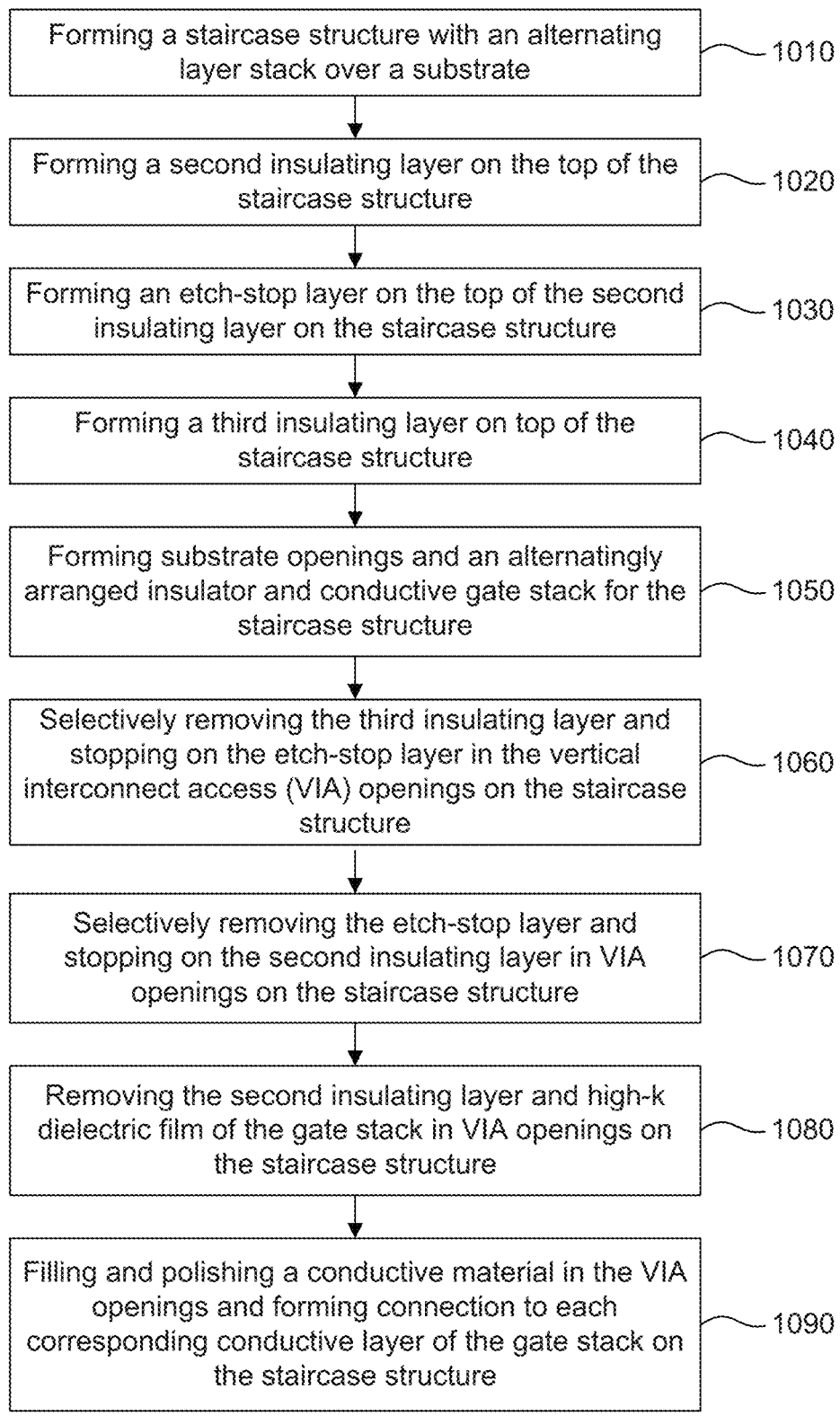
FIG. 10 illustrates a process flow for forming multi-level contacts in a 3D memory structure, in accordance with some embodiments of the present disclosure.

FIG. 10 illustrates an exemplary method 1000 for forming the word line contacts for a three-dimensional memory array, according to some embodiments. The processing steps of the method 1000 can be used to form memory device structures illustrated in FIGS. 1-9. The processing steps shown in method 1000 are not exhaustive and other processing steps can be performed as well before, after, or between any of the illustrated process steps. In some embodiments, some processing steps of exemplary method 1000 can be omitted or include other processing steps that are not described here for simplicity. In some embodiments, processing steps of method 1000 can be performed in a different order and/or vary.

At process step 1010, an alternating layer stack is disposed over a substrate, followed by a repetitive etch-trim process to form a staircase structure. An example of the substrate can be the substrate 101 described in FIG. 1. A layer stack within the alternating layer stack can include a dielectric layer pair with a first insulating layer over a sacrificial layer. The first insulating layer can be the first insulating layer 104 in FIG. 1 and the sacrificial layer can be the sacrificial layer 106 in FIG. 1, and the dielectric layer pair can be formed using similar techniques as the first insulating layer 104 and the sacrificial layer 106.

One cycle of the repetitive etch-trim process includes an etching process that etches a height of a staircase step and a trimming process that determines a width of a staircase step. The etch-trim process is repeated for a number of cycles, corresponding to the number of steps or the number of dielectric layer pairs on the staircase structure. A mask stack can be used for patterning and can be removed after the etch-trim process.

At process step 1020, a second insulating layer is disposed on the staircase structure with alternating film stacks. The second insulating layer can be the second insulating layer 208 in FIG. 2 and can be formed using a similar technique.

At process step 1030, an etch-stop layer is disposed on the top surface of the second insulating layer on the staircase structure. The etch-stop layer can be the etch stop layer 310 in FIG. 3, and can be formed using a similar technique.

At process step 1040, a third insulating layer is disposed on the top surface of the etch-stop layer over the staircase structure, followed by an optional planarization process, to form a surface coplanar with the uppermost portion of the etch-stop layer. The third insulating layer can be the third insulating layer 420 in FIG. 4, and can be formed using a similar technique.

At process step 1050, an opening to the substrate is formed by etching through the entire film stack. Through the opening, the sacrificial layer of each dielectric layer pair in the staircase structure is removed and replaced by a gate stack. A similar structure is shown in FIGS. 5A and 5B. The gate stack can be the gate stack 525 in FIGS. 5A and 5B. The opening to the substrate can be the substrate opening 522 in FIG. 5A. Removing the sacrificial layer includes wet etching or isotropic dry etching that is selective to the surrounding first and second insulating layer. Disposing the gate stack includes first disposing a high-k dielectric layer and then a gate conductive layer. The high-k dielectric layer can be the high-k dielectric layer 525H in FIG. 5B, and can be formed using a similar technique. The gate conductive layer can be the gate conductive layer 525M, and can also be formed using a similar technique.

Process step 1050 also includes removing the gate conductive layer (or the conductive portion) from the sidewalls of the substrate opening and forming an isolation barrier layer. Removing the gate conductive layer from the sidewall can be achieved by wet-etching or dry-etching. The sidewall isolation layer can be fifth insulating layer 530 in FIGS. 5A and 5B, and can be formed using a similar technique. The sidewall isolation material deposited on the substrate surface at the bottom of the opening can be removed by anisotropic dry-etching.

At process step 1060, a second conductive material can be disposed over the staircase structure, forming a substrate conductive structure inside the substrate opening. The substrate conductive structure can be the substrate conductive structure 643 in FIG. 6. A planarization process, for example, chemical mechanical polishing, can be used to form coplanar top surfaces between the substrate conductive structure and the third insulating layer.

At process step 1060, contact VIA openings are also formed for each staircase level with selective etching. The contact VIA openings can be the same VIA openings 640 in FIG. 6. The etching rate of the third insulating layer can be higher than the etching rate of the etch-stop layer. Therefore, deep openings can be made for the bottom staircase level, while the etch-stop layer is not punched through on the uppermost staircase level.

At process step 1070, the etch-stop materials inside the VIA openings are removed by reverse selective etching. During reverse selective etching, the etch-stop layer can be etched faster than the second insulating layer. At this step, the VIA openings can be the VIA openings 740 in FIG. 7.

At process step 1080, the second insulating layer and the high-k dielectric layer of the gate stack is removed inside the VIA openings, by using a similar etching process as that for the third insulating layer or the etch-stop layer. The conductive material of the gate stack is exposed inside the VIA openings, enabling electrical connections to the gate of every 3D memory cell. At this step, the VIA openings can be the VIA openings 840 in FIGS. 8A and 8B.

At process step 1090, VIA conductive structures are formed by disposing and filling a third conductive material in all the VIA openings in the structure. The VIA conductive structure can be the VIA conductive structures 945 in FIGS. 9A and 9B. The third conductive material can be planarized subsequently to form a coplanar surface with the top surface of the third insulating layer. The planarization process includes chemical mechanical polishing (CMP). Residual conductive materials outside the VIA openings can be removed by touch-up dry etching or wet etching. As a result, the conductive material in the VIA openings is connected with the conductive material of the gate stack for each level of the staircase structure. Therefore, the embedded gates of the vertically stacked 3D memory cells can be electrically connected from a planar surface on the top of the structure in the subsequent back-of-line processes, enabling various configurations of word lines for the 3D memory array.

Process steps 1010-1050 illustrate the formation of the staircase structure 500 in FIG. 5, in accordance with some embodiments of the present disclosure, using a replacement gate technique. In this example, the sacrificial layer 106 is formed first on the staircase structure 100 in FIG. 1 at process steps 1010. The sacrificial layer 106 can be replaced by the gate stack 525 at process step 1050 to form staircase structure 500. Detailed structure and method of 3D memory with replacement gate is described in co-pending U.S. patent application, titled "Method for Forming Gate Structure of Three-Dimensional Memory Device," (application Ser. No. 16/047,158 and filed on Jul. 27, 2018), which is incorporated herein by reference in its entirety.

In some embodiments, the staircase structure 500 can also be formed with a so called "gate-first" approach, where a gate conductive layer can be disposed in FIG. 1 and at process steps 1010, in place of the sacrificial layer 106. The gate conductive layer can be a similar material as the gate conductive layer 525M in FIG. 5B and can be formed using similar techniques. The etch-trim process to form the staircase structure 100 can be modified accordingly so that the gate conductive layer 525M can be etched instead of the sacrificial layer 106. As such, the sacrificial layer 106 in FIGS. 2-4 can also be replaced by the gate conductive layer 525M. At process step 1050, the step of removing the sacrificial layer 106 can be skipped in this embodiment. The substrate opening 522, the VIA openings 640/740/840, and the conductive structures 643/945 can be formed similarly as the ones in FIGS. 5-9 and using similar methods in process steps 1050-1090.

In some embodiments, a semiconductor structure includes a staircase structure having a plurality of steps, and each step includes a conductive layer disposed over a dielectric layer. The semiconductor structure further includes a barrier layer disposed over a portion of the conductive layer of the each step. The semiconductor structure also includes an etch-stop layer disposed on the barrier layer and an insulating layer disposed on the etch-stop layer. The semiconductor structure also includes a plurality of conductive structures formed in the insulating layer and extending through the etch-stop layer and the barrier layer. Each conductive structure directly contacts the conductive layer of the each step.

In some embodiments, a semiconductor structure includes a staircase structure having a plurality of steps, and each step includes a conductive layer disposed over a dielectric layer. The semiconductor structure further includes an etch-stop layer disposed over a portion of the conductive layer of the each step and an insulating layer disposed on the etch-stop layer. The semiconductor structure further includes a plurality of conductive structures formed in the insulating layer and extending through the etch-stop layer. Each of the conductive structure directly contacts the corresponding conductive layer of the each step.

In some embodiments, a method for forming a semiconductor structure includes forming a plurality of steps of a staircase structure. Forming each step of the plurality of steps includes disposing a sacrificial layer over a dielectric layer and disposing an etch-stop layer on each step of the plurality of steps. The method further includes disposing an insulating layer on the etch-stop layer and replacing the sacrificial layer with a conductive layer for each step of the staircase structure. The method also includes forming a plurality of openings in the insulating layer and exposing portions of the etch-stop layer. The method also includes etching the exposed portions of the etch-stop layer in the plurality of openings and exposing the conductive layer of each step. The method also includes forming a plurality of conductive structures and each conductive structure is respectively formed in each opening of the plurality of openings.

The foregoing description of the specific embodiments will so fully reveal the general nature of the present disclosure that others can, by applying knowledge within the skill of the art, readily modify and/or adapt, for various applications, such specific embodiments, without undue experimentation, and without departing from the general concept of the present disclosure. Therefore, such adaptations and modifications are intended to be within the meaning and range of equivalents of the disclosed embodiments, based on the disclosure and guidance presented herein. It is to be understood that the phraseology or terminology herein is for the purpose of description and not of limitation, such that the terminology or phraseology of the present specification is to be interpreted by the skilled artisan in light of the disclosure and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections can set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A semiconductor structure, comprising:
a staircase structure comprising a plurality of steps, wherein each step comprises a gate stack disposed over a dielectric layer, the gate stack comprising a high-k dielectric layer and a conductive layer;
a barrier layer disposed over a portion of the gate stack of the each step;
an etch-stop layer disposed on the barrier layer;
an insulating layer disposed on the etch-stop layer; and
a plurality of conductive structures formed in the insulating layer, wherein each conductive structure is formed on the conductive layer of the each step.

2. The semiconductor structure of claim 1, wherein the plurality of conductive structures extend through the barrier layer and the high-k dielectric layer.

3. The semiconductor structure of claim 1, wherein the plurality of conductive structures extend through the etch-stop layer.

4. The semiconductor structure of claim 1, wherein the barrier layer comprises silicon oxide.

5. The semiconductor structure of claim 1, wherein the etch-stop layer comprises one or more of silicon nitride, a spin-on-dielectric, and a high-k dielectric.

6. The semiconductor structure of claim 1, wherein the each conductive structure directly contacts a corresponding one of the conductive layer of the each step.

7. The semiconductor structure of claim 1, wherein top surfaces of the plurality of conductive structures, the insulating layer, and a portion of the etch-stop layer are coplanar.

8. The semiconductor structure of claim 1, wherein the plurality of conductive structures comprise one or more of tungsten, cobalt, nickel, copper, and aluminum.

9. The semiconductor structure of claim 1, wherein the barrier layer is formed on side and top surfaces of the plurality of steps.

10. The semiconductor structure of claim 1, wherein a thickness of the etch-stop layer is in a range between 10 nm and 1000 nm.

11. The semiconductor structure of claim 1, wherein the high-k dielectric layer comprises hafnium oxide, zirconium oxide, aluminum oxide, tantalum oxide, lanthanum oxide, or a combination thereof.

12. The semiconductor structure of claim 1, wherein top and bottom surfaces and a sidewall of the conductive layer are covered by the high-k dielectric layer, except at an interface between the conductive layer and the conductive structure.

13. A semiconductor structure, comprising:
a staircase structure comprising a plurality of steps, wherein each step comprises a gate stack disposed over a dielectric layer, the gate stack comprising a high-k dielectric layer and a conductive layer;
an etch-stop layer disposed on a portion of the gate stack of the each step;
an insulating layer disposed on the etch-stop layer; and
a plurality of conductive structures formed in the insulating layer and extending through the etch-stop layer and the high-k dielectric layer, wherein each conductive structure directly contacts the corresponding conductive layer of each step.

14. The semiconductor structure of claim 13, wherein the etch-stop layer is formed on a side surface and a top surface of each step.

15. The semiconductor structure of claim 14, wherein thicknesses of the etch-stop layer is the same on the side and top surfaces of each step.

16. The semiconductor structure of claim 13, wherein the etch-stop layer comprises one or more of silicon nitride, a spin-on-dielectric, and a high-k dielectric.

17. The semiconductor structure of claim 13, wherein a thickness of the etch-stop layer is in a range between 10 nm and 1000 nm.

18. The semiconductor structure of claim 13, wherein the high-k dielectric layer comprises hafnium oxide, zirconium oxide, aluminum oxide, tantalum oxide, lanthanum oxide, or a combination thereof.

19. The semiconductor structure of claim 13, wherein top and bottom surfaces and a sidewall of the conductive layer are covered by the high-k dielectric layer, except at an interface between the conductive layer and the conductive structure.

* * * * *